(12) United States Patent
Lan

(10) Patent No.: US 9,997,546 B2
(45) Date of Patent: Jun. 12, 2018

(54) ARRAY SUBSTRATE, DISPLAY PANEL, AND DISPLAY DEVICE

(71) Applicant: XIAMEN TIANMA MICRO-ELECTRONICS CO., LTD., Xiamen (CN)

(72) Inventor: Xuexin Lan, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days. days.

(21) Appl. No.: 15/800,096

(22) Filed: Nov. 1, 2017

(65) Prior Publication Data

US 2018/0053795 A1 Feb. 22, 2018

(30) Foreign Application Priority Data

Mar. 31, 2017 (CN) .......................... 2017 1 0210704

(51) Int. Cl.
| | |
|---|---|
| *H01L 27/12* | (2006.01) |
| *G02F 1/136* | (2006.01) |
| *G02F 1/1343* | (2006.01) |
| *G02F 1/1362* | (2006.01) |

(52) U.S. Cl.
CPC .... *H01L 27/1255* (2013.01); *G02F 1/134336* (2013.01); *G02F 1/136213* (2013.01); *G02F 1/136286* (2013.01); *H01L 27/124* (2013.01); *H01L 27/1214* (2013.01); *G02F 2001/134354* (2013.01); *G02F 2001/136245* (2013.01); *G09G 2300/0876* (2013.01)

(58) Field of Classification Search
None
See application file for complete search history.

(56) References Cited

U.S. PATENT DOCUMENTS

| | | | |
|---|---|---|---|
| 8,810,491 B2* | 8/2014 | Wu ....................... | G09G 3/2025 345/212 |
| 2009/0002586 A1* | 1/2009 | Kimura ............. | G02F 1/136213 349/39 |
| 2011/0013105 A1* | 1/2011 | Jung ................. | G02F 1/136213 349/38 |

\* cited by examiner

*Primary Examiner* — Minh-Loan Tran
(74) *Attorney, Agent, or Firm* — Kilpatrick Townsend & Stockton LLP

(57) ABSTRACT

The invention discloses an array substrate, a display panel, and a display device, where at least one control capacitor is added to a pixel zone, and the control capacitor has a first electrode at a fixed potential, and a second electrode at the same potential as a node between two adjacent transistors, so that when an active gate scan signal is stopped from being loaded on a gate line, the potential of the second electrode of the control capacitor is controlled to be kept at the potential of data signal loaded on a data line, to thereby lower the difference in voltage between the source and the drain of a transistor associated with the second electrode of the control capacitor so as to keep the potential at a connection point of the transistor with a storage capacitor to be the potential of a data signal loaded on the data line.

20 Claims, 14 Drawing Sheets

ARRAY SUBSTRATE, DISPLAY PANEL, AND DISPLAY DEVICE

CROSS-REFERENCES TO RELATED APPLICATIONS

This application claims priority to Chinese patent application No. 201710210704.5 filed on Mar. 31, 2017 and titled "ARRAY SUBSTRATE, DISPLAY PANEL, AND DISPLAY DEVICE", which is incorporated herein by reference in its entirety.

FIELD

The present invention relates to the field of display technologies, and particularly to an array substrate, a display panel, and a display device.

BACKGROUND

In a liquid crystal display, in order to avoid a screen from flicking due to insufficient charging of a pixel electrode in a pixel structure, it is typically necessary to maintain a stable potential across a source and a drain of a transistor connected with the pixel electrode to thereby lower the difference in voltage between the source and the drain so as to reduce leakage current in the transistor.

Typically the transistor connected with the pixel electrode is in a single-gate structure, where when a gate scan signal is stopped from being loaded to a gate line, a node between a storage capacitor and the transistor is floating, and also due to a parasitic capacitance between the gate line and a data line, the potential of the node may so fluctuate with elapsing time that the potential may gradually deviate from the potential of a data signal loaded to the data line, thus resulting in a larger difference in voltage between the source and the drain of the transistor, which may come with higher leakage current, thus degrading the display quality of a picture. In the prior art, in order to reduce the leakage current of the transistor, typically the single-gate transistor is replaced with a dual-gate transistor. FIG. 1A illustrates a top view of an array substrate, where 101 represents a gate line, 102 represents a data line, 103 represents a common electrode, and 104 represents a pixel electrode; and FIG. 1B illustrates an equivalent circuit diagram corresponding to FIG. 1A, where there are a dual-gate structure including a first transistor $T_1$ and a second transistor $T_2$, and a storage capacitor $C_0$; the storage capacitor $C_0$ has a terminal m, which is the pixel electrode 104, and a terminal n, which is the common electrode 103. Both the gate of the first transistor $T_1$, and the gate of the second transistor $T_2$ are connected with the gate line GATE, the drain of the first transistor $T_1$ is connected with the pixel electrode 104, and the source of the second transistor $T_2$ is connected with the data line DATA; and when an active gate scan signal is loaded to the gate line GATE, both the first transistor $T_1$ and the second transistor $T_2$ are turned on, and a data signal input on the data line DATA flows through the first transistor $T_1$ and the second transistor $T_2$ to charge the pixel electrode 104 connected with the node $P_0$. However if the active gate scan signal is stopped from being loaded to the gate line GATE, both the first transistor $T_1$ and the second transistor $T_2$ are turned off, and both the node $P_0$ and the node $P_1$ are floating; and also due to a parasitic capacitor between the gate line GATE and the data line DATA, the potentials of the node $P_0$ and the node $P_1$ fluctuate as the first transistor $T_1$ and the second transistor $T_2$ are turned off, and the time is elapsing, where particularly the potential of the node $P_1$ more significantly fluctuate. As the result of some simulation showed, the potential of the node $P_1$ may fluctuate by approximately 11V at most, thus resulting in a larger difference in voltage between the source and the drain of the first transistor $T_1$, which may come with larger leakage current. Apparently the leakage current may not be significantly reduced in the transistor with dual gates.

In view of this, it is highly desirable for those skilled in the art to greatly reduce the leakage current in the transistor to thereby charge the pixel electrode sufficiently so as to improve the quality of a picture on the liquid crystal display.

SUMMARY

Embodiments of the invention provide an array substrate, a display panel, and a display device so as to greatly reduce the leakage current in the transistor to thereby charge the pixel electrode sufficiently so as to improve the quality of a picture on the liquid crystal display, as desirable in the prior art.

An embodiment of the invention provides an array substrate including: a substrate, gate lines and data lines arranged on the substrate crossing each other, a plurality of pixel zones arranged in an array and defined by the gate lines and the data lines, and a pixel switch, a storage capacitor, and at least one control capacitor in each of the plurality of pixel zones, and the pixel switch includes at least two transistors connected in series, and gates of the at least two transistors are connected with one of the gate lines, a first transistor among the at least two transistors connected in series is connected with one terminal of the storage capacitor, and a last transistor among the at least two transistors connected in series is connected with one of the data lines; and the number of the at least one control capacitor is less than the number of the at least two transistors; the control capacitor includes a first electrode at a fixed potential, and a second electrode at the same potential as a node between two adjacent ones of the transistors; and the control capacitor is configured to control the potential of the second electrode of the control capacitor to be kept at the potential of a data signal loaded on the data line, when an active gate scan signal is stopped from being loaded on the gate line.

An embodiment of the invention further provides a display panel including the array substrate above according to the embodiment of the invention.

An embodiment of the invention further provides a display device including the display panel above according to the embodiment of the invention.

Advantageous effects of the invention are as follows.

In the array substrate, the display panel, and the display device according to the embodiments of the invention, at least one control capacitor is added to a pixel zone, and the control capacitor has a first electrode at a fixed potential, and a second electrode at the same potential as a node between two adjacent transistors, so that when an active gate scan signal is stopped from being loaded on a gate line, the potential of the second electrode of the control capacitor is controlled to be kept at the potential of a data signal loaded on a data line, to thereby lower the difference in voltage between the source and the drain of a transistor associated with the second electrode of the control capacitor, so as to keep the potential at a connection point of the transistor with a storage capacitor to be the potential of a data signal loaded on the data line, thus charging the pixel electrode sufficiently, and alleviating a picture from flickering due to insufficient charging thereof, etc.

DETAILED DESCRIPTION

Figure 1A:
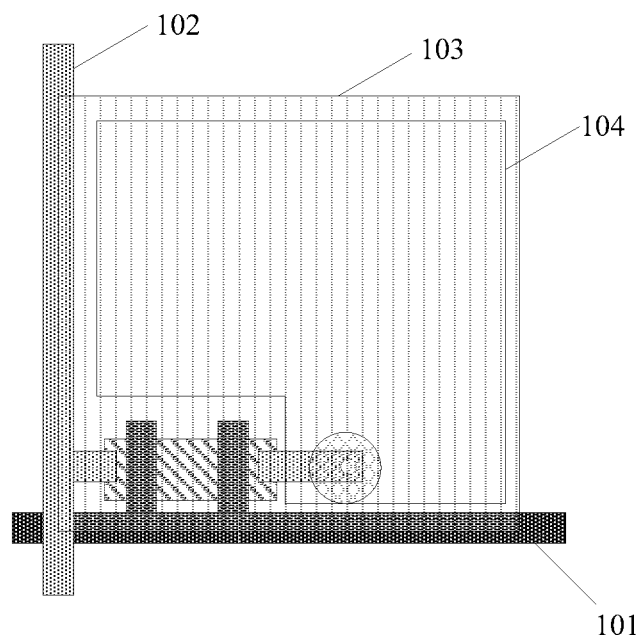
FIG. 1A is a top view of a pixel zone in the prior art.
Figure 1B:
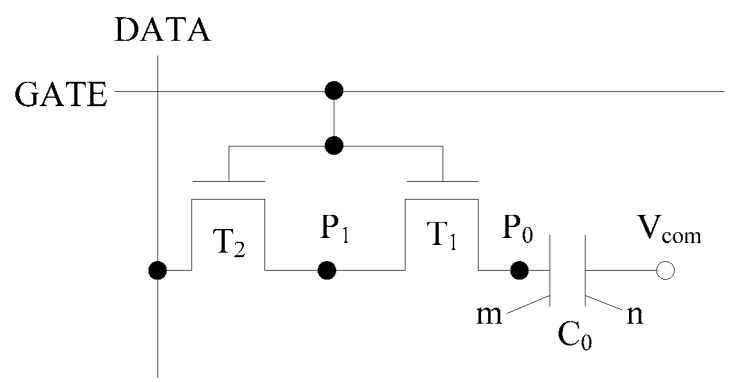
FIG. 1B is an equivalent circuit diagram to FIG. 1A.

Some embodiments of an array substrate, a display panel, and a display device may be described below in details with reference to the drawings.

The shapes and sizes of respective components in the drawings are not intended to reflect their actual proportions, but only intended to illustrate the disclosure of the invention.

Figure 2A:
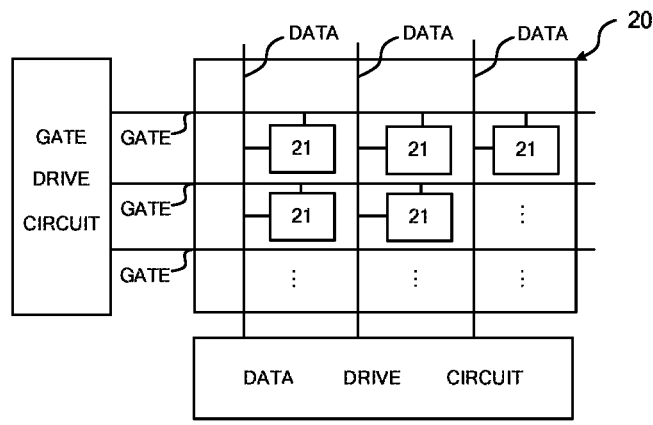
FIG. 2A is a schematic structural diagram of the array substrate in accordance with embodiments of the invention.

An embodiment of the invention provides an array substrate, as illustrated in FIG. 2A, which can include: a substrate 20, gate lines and data lines disposed on the substrate crossing each other, a plurality of pixel zones 21 arranged in an array and defined by the gate lines and the data lines, and a pixel switch, a storage capacitor, and at least one control capacitor in each of the plurality of pixel zones; and in the equivalent circuit diagrams as illustrated in FIG. 2B to FIG. 2E, there is a pixel switch 201, a storage capacitor $C_0$, and at least one control capacitor $C_S$ in a pixel zone.

The pixel switch 201 includes at least two transistors T connected in series, where gate of each transistor T is connected with a gate line GATE, the first transistor $T_1$ among the transistors T connected in series is connected with a terminal m of the storage capacitor $C_0$, and the last transistor $T_2$ among the transistors T connected in series is connected with a data line DATA; and the terminal m of the storage capacitor $C_0$ has a potential of a pixel electrode, and the terminal n thereof has a potential of a common electrode, and a drain of the first transistor $T_1$ is connected with the pixel electrode (not illustrated in FIG. 2B to FIG. 2E).

The number of control capacitors $C_S$ is less than the number of transistors T; the control capacitor $C_S$ includes a first electrode a at a fixed potential $V_s$, and a second electrode b at the same potential as a node between two adjacent transistors T; and the control capacitor $C_S$ is configured to control the potential of the second electrode b of the control capacitor $C_S$ to be kept at the potential of a data signal loaded on the data line DATA, when an active gate scan signal is stopped from being loaded on the gate line GATE.

In the array substrate above according to the embodiment of the invention, the at least one control capacitor $C_S$ is added to the pixel zone, the first electrode a of the control capacitor $C_S$ is at the fixed potential $V_s$, and the second electrode b thereof has the same potential as a node between two adjacent transistors, so that when an active gate scan signal is stopped from being loaded on the gate line GATE, the potential of the second electrode b of the control capacitor $C_S$ is controlled to be kept at the potential of a data signal loaded on the data line DATA, to thereby lower the difference in voltage between the source and the drain of the transistor associated with the second electrode b of the control capacitor $C_S$ so as to keep the potential at the connection point of the transistor T with the storage capacitor $C_0$ to be the potential of a data signal loaded on the data line DATA, thus charging the pixel electrode sufficiently, and alleviating a picture from flickering due to insufficient charging thereof, etc.

In some implementations, in order to charge the pixel electrode sufficiently, and to avoid the potential of a node between two adjacent transistors from significantly fluctuating due to the parasitic capacitor between the gate line and the data line after a transistor in the pixel switch is turned off, the capacitance of the control capacitor is less than the capacitance of the storage capacitor, and more than the capacitance of the parasitic capacitor between the gate line and the data line; and of course, the capacitance of the control capacitor can be adjusted according to the distance between the first electrode and the second electrode of the control capacitor, and the area of the first electrode facing the second electrode.

In one embodiment, in the array substrate above according to the embodiment of the invention, if there are a plurality of control capacitors in a pixel zone, then capacitances of the plurality of control capacitors in the pixel zone may be equal to each other to thereby effective control the potentials of the second electrodes of the respective control capacitors.

In one embodiment, in order to charge the pixel electrodes in the respective pixel zones sufficiently for uniform brightness of a picture to be displayed, capacitances of respective control capacitors in different pixel zones are equal to each other in the array substrate above according to the embodiment of the invention.

Figure 2B:
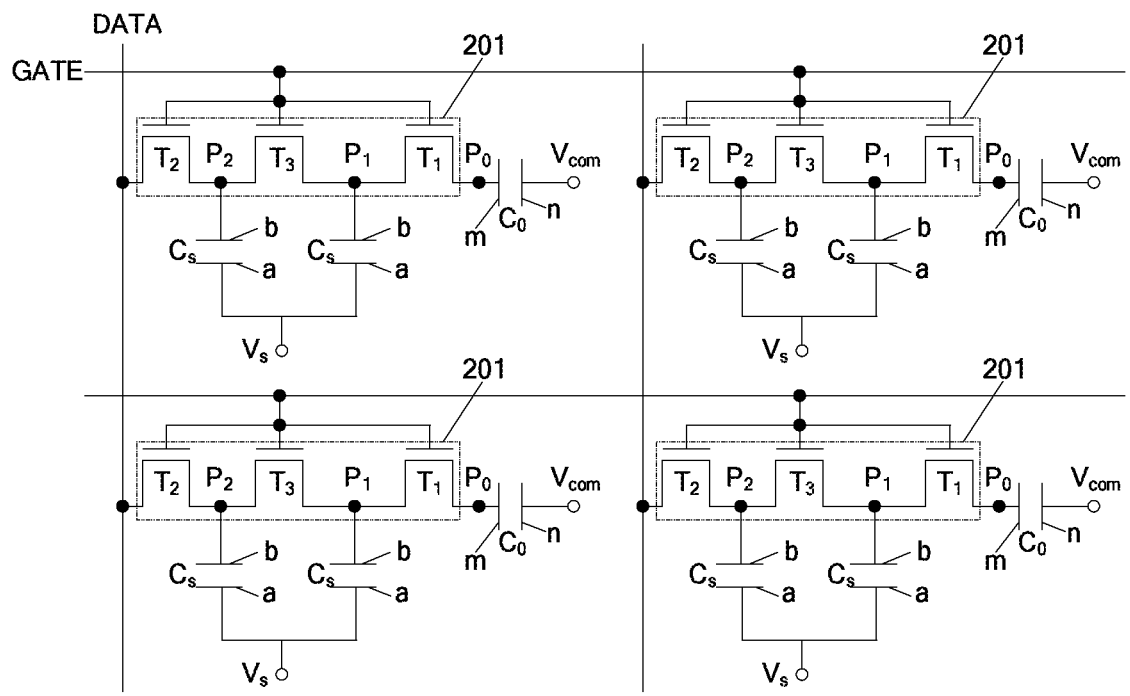
FIG. 2B to FIG. 2E are equivalent circuit diagrams in accordance with embodiments of the invention respectively.
Figure 2C:
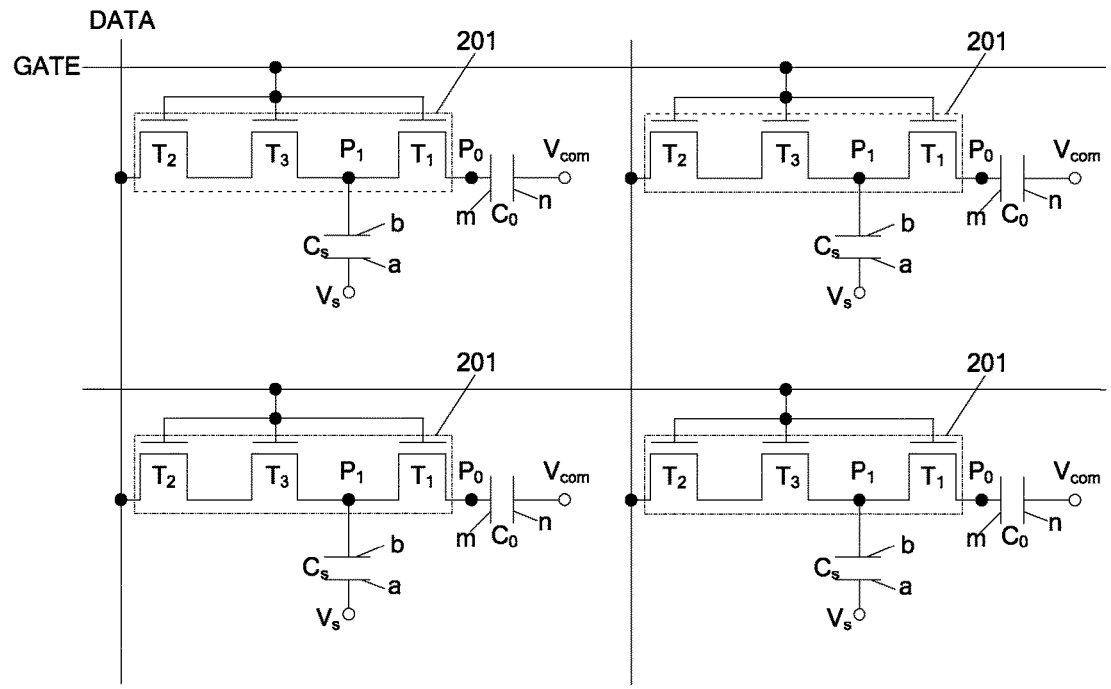
Figure 2D:
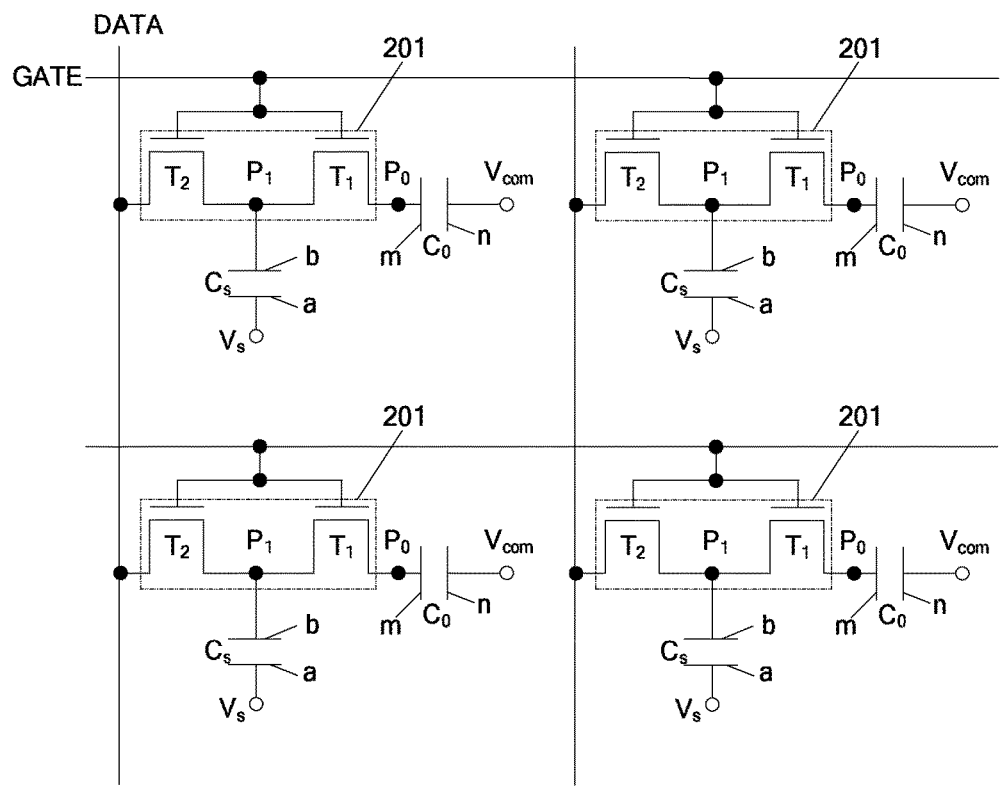
Figure 2E:
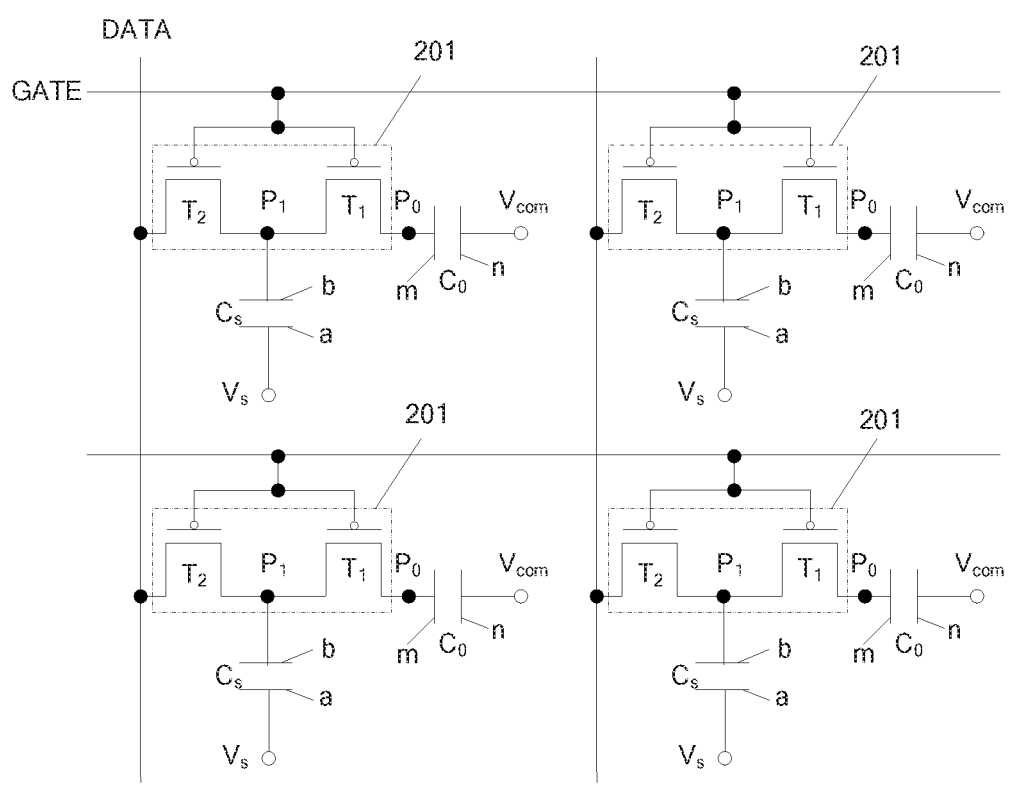

In one implementation, in order to highlight the role of the control capacitor $C_S$ in reducing the leakage current of the transistor T, in the array substrate above according to the embodiment of the invention, typically there are no more than three transistors in the pixel switch, where there may be three transistors T in the pixel switch 201 as illustrated in FIG. 2B and FIG. 2C; or there may be two transistors T in the pixel switch 201 as illustrated in FIG. 2D and FIG. 2E.

In one embodiment, as illustrated in FIG. 2B and FIG. 2C, if there are three transistors T in the pixel switch 201, then they may be a first transistor $T_1$, a second transistor $T_2$, and a third transistor $T_3$, all of which are in a common-gate structure in which the gates of the first transistor $T_1$, the second transistor $T_2$, and the third transistor $T_3$ are connected with the gate line GATE, the drain of the first transistor $T_1$ is connected with a node $P_0$, and the source of the transistor $T_1$ is connected with a node $P_1$; the drain of the second transistor $T_2$ is connected with a node $P_2$, and the source of the second transistor $T_2$ is connected with the data line DATA; and the drain of the third transistor $T_3$ is connected with the node $P_1$, and the source of the third transistor $T_3$ is connected with the node $P_2$.

Of course, as illustrated in FIG. 2D and FIG. 2E, if there are two transistors T in the pixel switch 201, then they may be a first transistor $T_1$ and a second transistor $T_2$, both of which are in a dual-gate structure in which both the gates of the first transistor $T_1$ and the second transistor $T_2$ are connected with the gate line GATE, the drain of the first transistor $T_1$ is connected with a node $P_0$, and the source of the transistor $T_1$ is connected with a node $P_1$; and the drain of the second transistor $T_2$ is connected with the node Pt, and the source of the second transistor $T_2$ is connected with the data line DATA.

Furthermore both the first transistor $T_1$ and the second transistor $T_2$ may be N-type transistors or P-type transistors. As illustrated in FIG. 2D, if both the first transistor $T_1$ and the second transistor $T_2$ are N-type transistors, then an active gate scan signal loaded on the gate line GATE may be a high-level signal; and as illustrated in FIG. 2E, if both the first transistor $T_1$ and the second transistor $T_2$ are P-type transistors, then an active gate scan signal loaded on the gate line GATE may be a low-level signal.

Of course, the transistors T as referred to in the array substrate above according to the embodiment of the invention may be Thin Film Transistors (TFTs), or may be Metal Oxide Semiconductor (MOS) field effect transistors; and the sources and the drains of the transistors T (including the first transistor $T_1$, the second transistor $T_2$, and the third transistor $T_3$) can be fabricated in the same process, and their denominations may be interchangeable with each other dependent upon the direction of voltage to be allied thereto.

In one implementation, in the array substrate above according to the embodiment of the invention, in order to charge the pixel electrode sufficiently, the potential of the node $P_0$ needs to be controlled, and furthermore aspects of the invention releate to the potential of the closest node $P_1$ adjacent to the node $P_0$ to be kept at the potential of a data signal loaded on the data line DATA, to thereby lower the difference in voltage between the source and the drain of the first transistor $T_1$ so as to reduce leakage current. Accordingly one control capacitor $C_S$ can be arranged in a pixel zone so that the potential of the second electrode b of the control capacitor $C_S$ is the potential of the node $P_1$ between the first transistor $T_1$ and its adjacent transistor T, thus charging the pixel electrode sufficiently while lowering a cost of fabricating the array substrate as many as possible.

Of course there may be a plurality of control capacitors $C_S$ arranged in a pixel zone, but the number of control capacitors $C_S$ may be less than the number of transistors T, so if there are plurality of control capacitors $C_S$ to be arranged, then the second electrodes b of the respective control capacitors $C_S$ needs to be at the potentials of nodes between every two adjacent transistors T respectively. As illustrated in FIG. 2B, the second electrodes b of the control capacitors $C_S$ are at the potentials of the node $P_1$ and the node $P_2$ respectively, thus controlling the potentials of the respective nodes to thereby lower the differences in voltage between the sources and the drains of the respective transistors T so as to reduce leakage current for the pixel electrodes to be charged sufficiently.

In one embodiment, Table 1 depicts particular results of simulation on the structure as illustrated in FIG. 2D, where a pixel electrode is charged in a positive frame and in a negative frame; a charging voltage loaded on the data line DATA in a positive frame is 5V, and a charging voltage loaded on the data line DATA in a negative frame is −5V; and since all the transistors in a pixel zone are N-type transistors, there is gate-on voltage Vgh of typically 10V, and gate-off voltage Vgl of typically −7V. As can be apparent from the results in Table 1, no control capacitor $C_S$ is arranged in the pixel zone, and when the gate-on voltage Vgh is stopped from being loaded on the gate line GATE, the potential of the node $P_1$ drops from 5V to −6.261V, and −5V to −7.593V respectively, and the potential of the node $P_0$ drops from 5V to 4.789V, and −5V to −5.228V respectively; and apparently the potential of the node $P_1$ fluctutates more significantly, and the potential of the node $P_0$ fluctutates less significantly due to the presence of the storage capacitor $C_0$. If there is one control capacitor $C_S$ arranged in the pixel zone as illustrated in FIG. 2D and FIG. 2E, and the gate-on voltage Vgh is stopped from being loaded on the gate line GATE, the potential of the node $P_1$ drops from 5V to 4.433V, and −5V to −5.225V respectively, and the potential of the node $P_0$ drops from 5V to 4.742V, and −5V to −5.128V respectively; and apparently when the control capacitor $C_S$ is arranged, the stability of the potentials of the node $P_0$ and the node $P_1$ can be improved in effect; and after 350 milliseconds elapse after the gate-on voltage Vgh is stopped from being loaded on the gate line GATE, as can be apparent from the results in Table 1, the potential of the node $P_1$ is still stabilized, and furthermore the potential of the node $P_0$ is more stabilized, so the array substrate above according to the embodiment of the invention can have in effect the pixel electrode charged sufficiently, to thereby improve the quality of a picture to be displayed.

TABLE 1

| | | Charging in a positive frame | | Charging in a negative frame | |
|---|---|---|---|---|---|
| | | Prior art | The invention | Prior art | The invention |
| Gate-on voltage Vgh just stopped from being loaded on the gate line | Node $P_0$ | 4.789 V | 4.742 V | −5.228 V | −5.128 V |
| | Node $P_1$ | −6.261 V | 4.433 V | −7.593 V | −5.225 V |
| 350 μs after gate-on voltage Vgh is stopped from being loaded on the gate line | Node $P_0$ | 4.789 V | 4.842 V | −5.559 V | −5.128 V |
| | Node $P_1$ | −6.107 V | 4.433 V | −6.071 V | −5.224 V |

In one implementation, in the array substrate above according to the embodiment of the invention, the fixed potential of the first electrode of the control capacitor may be the potential of a common electrode, or may be another potential, e.g., gate-on voltage Vgh or gate-off voltage in a peripheral circuit area. However the common electrode is located in a display area of the array substrate. i.e., a pixel zone, and typically the storage capacitor is consisted of the pixel electrode and the common electrode; and the gate-on voltage Vgh or the gate-off voltage Vgl is located in the peripheral circuit area of the array substrate, so if the fixed potential of the first electrode of the control capacitor is the gate-on voltage Vgh or the gate-off voltage Vgl, then additional wiring may be used to electrically connect a gate-on voltage Vgh or gate-off voltage Vgl generator with the first electrode of the control capacitor, thus undoubtedly increasing the amount of wiring in the pixel zone, which may lower an opening ratio, and also they may a short-circuit or broken-circuit condition arising from a larger length of wiring. On the other hand, if the fixed potential of the first electrode of the control capacitor is the potential of the common electrode, then the first electrode of the control capacitor may be electrically connected with the common electrode in the pixel zone through a via-hole or a wire, and the via-hole or the wire can be patterned together with another film layer determined by the location of the via-hole or the wire without any additional fabrication process, thus lowering an influence thereof on an opening ratio. Moreover both an active layer, and the source and the drain of a transistor are typically made of a heavily doped material which is generally doped with phosphor at a concentration which may be $10^{20}$ atoms per cubic centimeter, thus resulting in a lower resistance of the active layer, which is approximately 500 ohms, so the active layer can operate as the second electrode of the control capacitor. Of course, the doping element of the active layer, and the doping concentration thereof may not be limited thereto, but there may be another doping element and another doping concentration as long as the resistance of the active layer is so low that the active layer can operate as the second electrode of the control capacitor. According in the array substrate above according to the embodiment of the invention, in order to avoid an additional fabrication process without lowering an opening ratio, the first electrode of the control capacitor can be at the potential of the common electrode, and the second electrode of the control capacitor can be at the potential of the active layer connected between two adjacent transistors.

The structure of the control capacitor is described below in details in some embodiments thereof by way of an example in which one control capacitor is arranged in a pixel zone, a pixel switch includes a first switch transistor and a second switch transistor, a first electrode of the control capacitor is at the potential of a common electrode, and a second electrode of the control capacitor is at the potential of an active layer connected between the first transistor and its adjacent transistor.

Figure 3A:
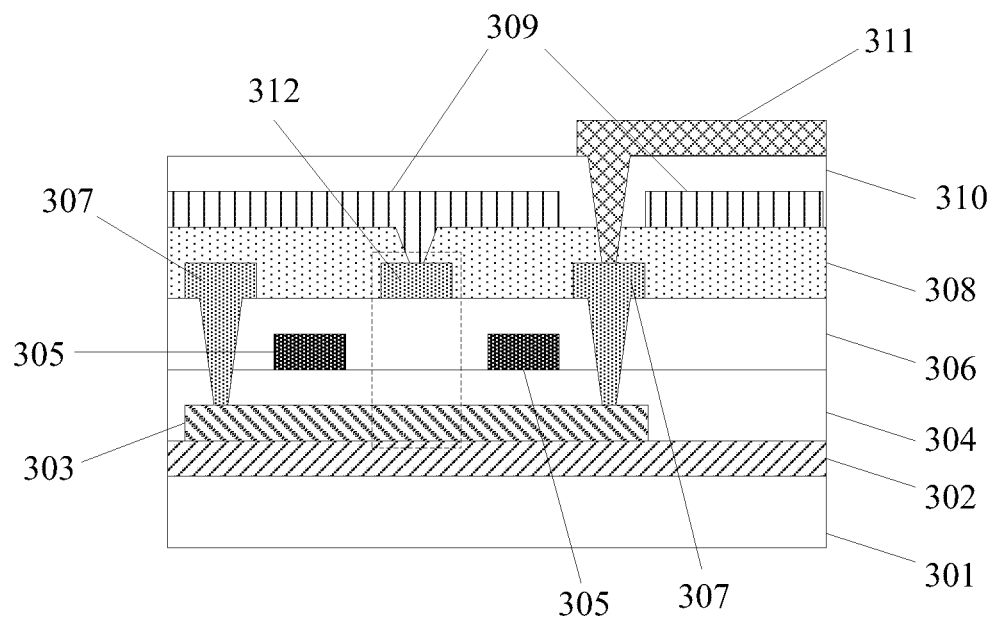
FIG. 3A to FIG. 3H are schematic structural diagrams of respective film layers in respective transistors in a top-gate structure in accordance with embodiments of the invention respectively.
Figure 3B:
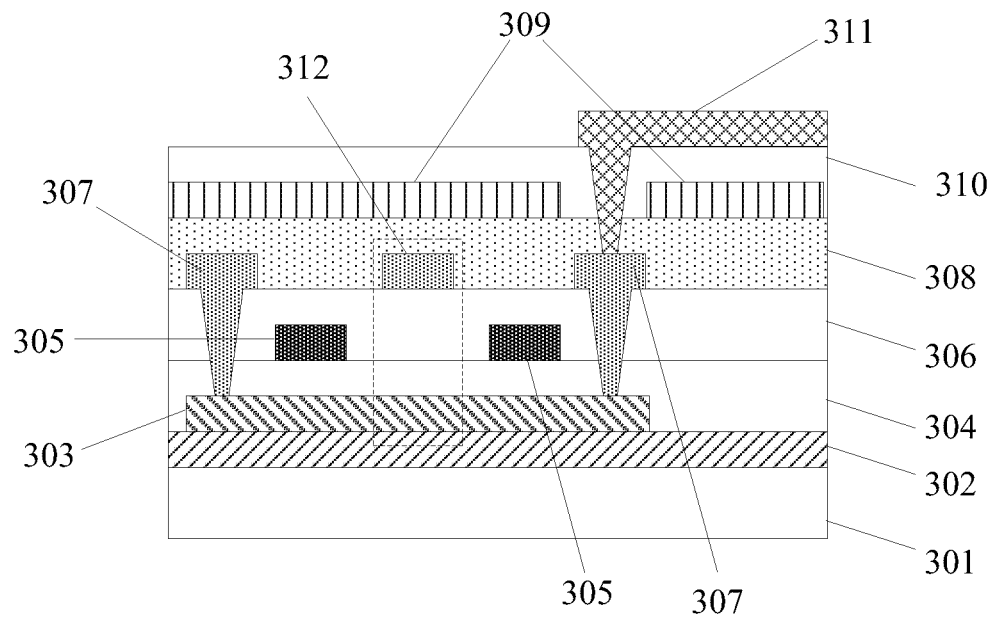
Figure 3C:
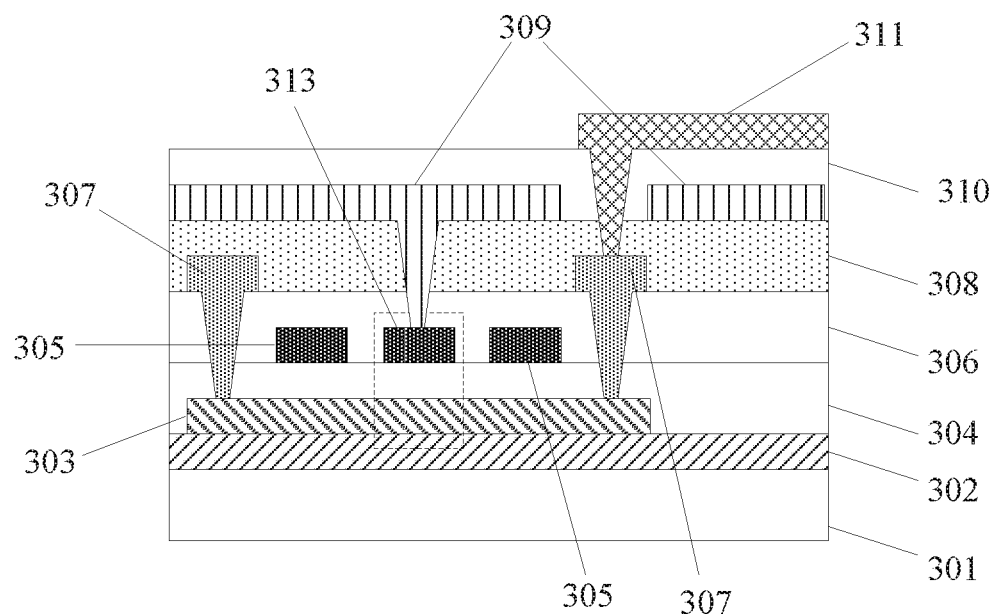
Figure 3D:
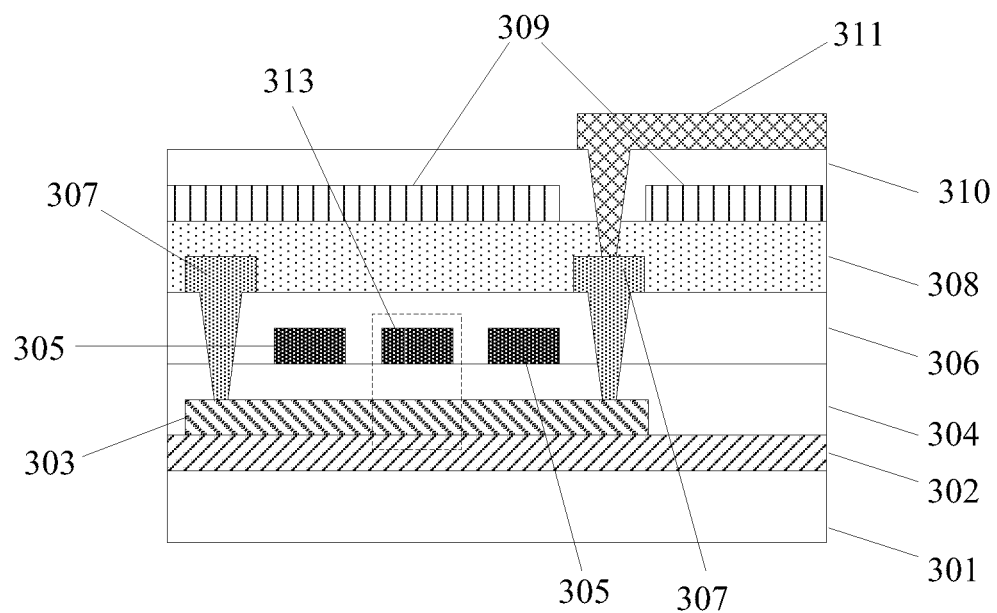
Figure 3E:
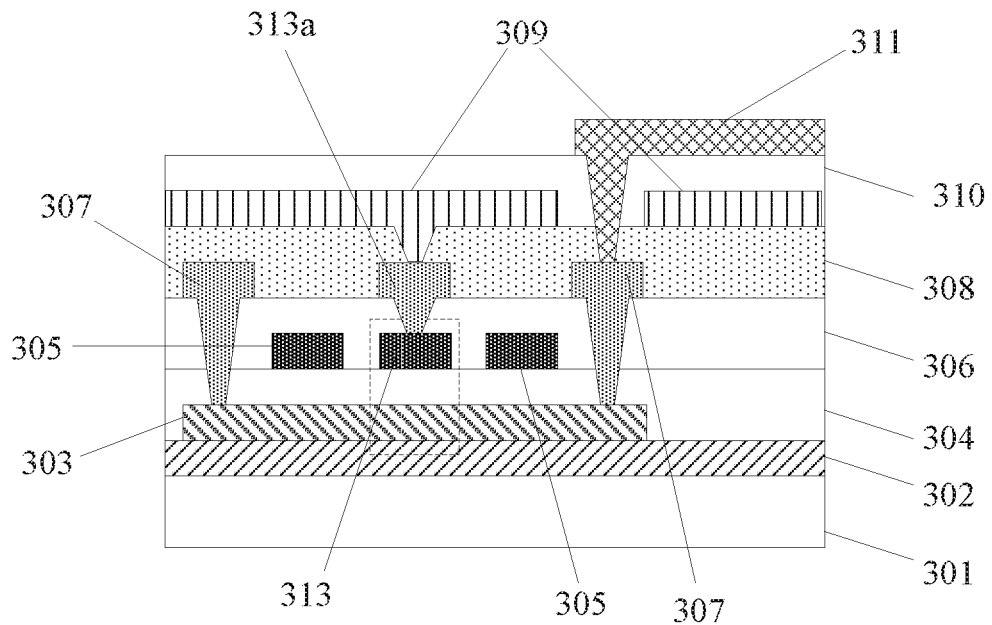
Figure 3F:
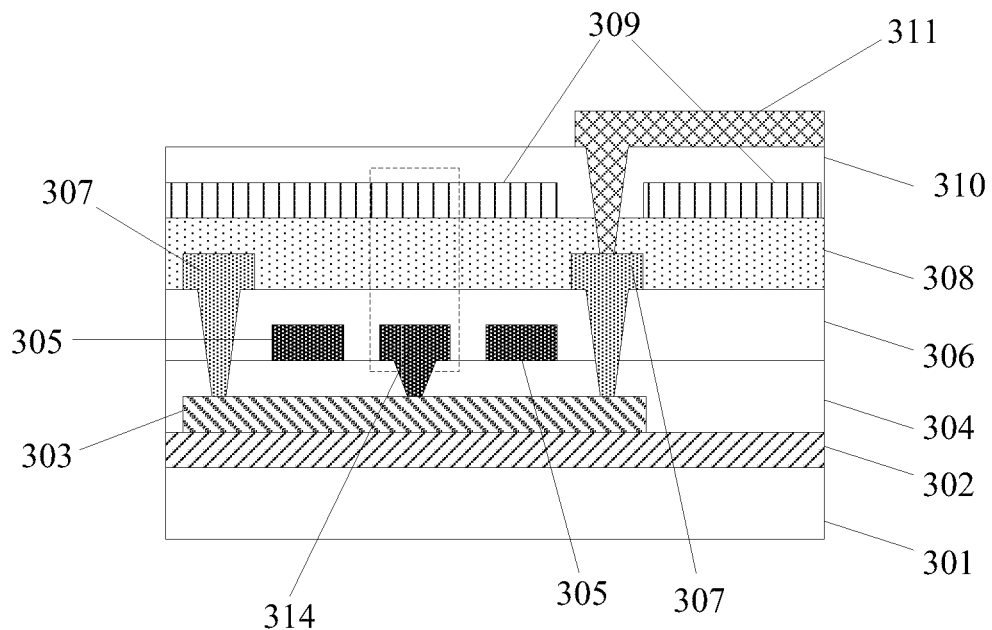
Figure 3G:
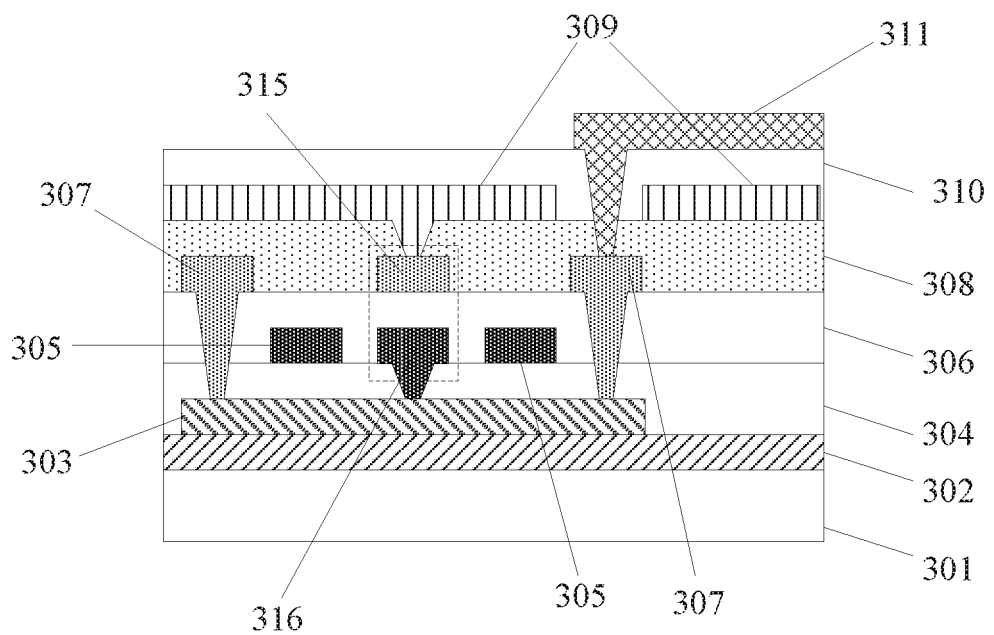
Figure 3H:
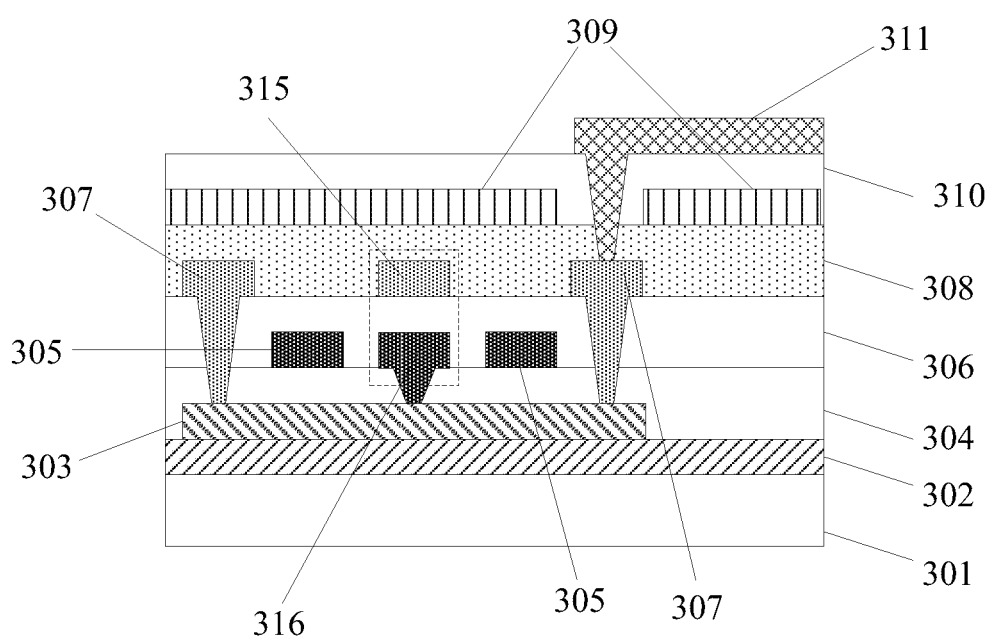
Figure 4:
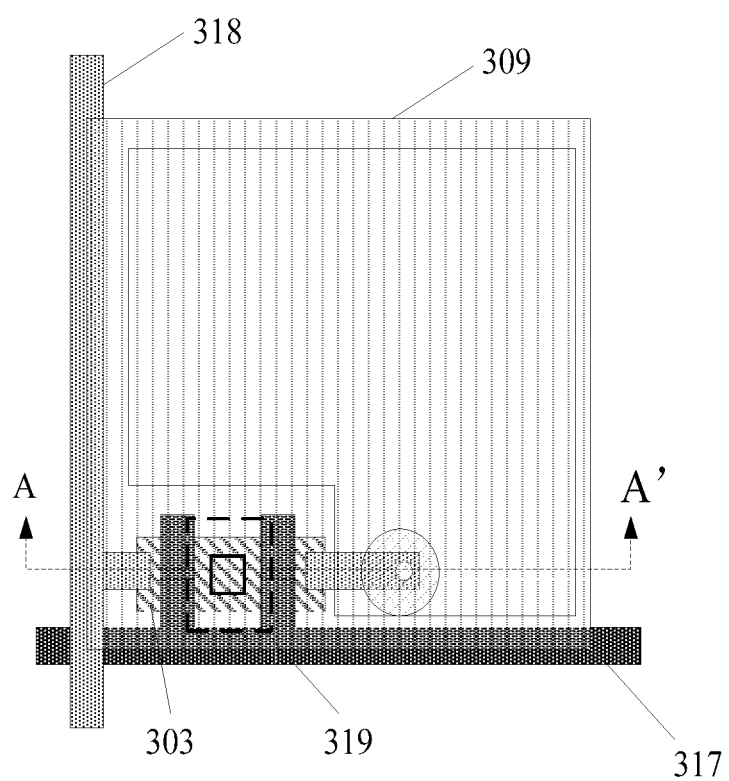
FIG. 4 is a top view of an array substrate in respective transistors in a top-gate structure in accordance with embodiments of the invention.

If both the first switch transistor and the second switch transistor are in a top-gate structure, then FIG. 3A to FIG. 3H may illustrate schematic structural diagrams of respective film layers, where 301 represents a base substrate, 302 represents a buffer layer, 303 represents an active layer, 304 represents a gate insulation layer, 305 represents the gate of a transistor, 306 represents a passivation layer, 307 represents a source or drain of the transistor, 308 represents a first insulation layer, 309 represents a common electrode, 310 represents a second insulation layer, and 311 represents a pixel electrode; and moreover FIG. 4 illustrates a top view of the array substrate, where 317 represents a gate line, 318 represents a data line, 309 represents the common electrode. 303 represents the active layer, and a dotted box 319 represents a control capacitor; and the dotted box 319 in FIG. 4 merely illustrates a rough position of the control capacitor in the top view, but a particular layer position of the control capacitor on the array substrate may be as illustrated in the side views of the array substrate in FIG. 3A to FIG. 3H which are side views thereof along AA' in FIG. 4.

In one embodiment, in FIG. 3A to FIG. 3H, since the respective transistors are in a top-gate structure, the array substrate needs to be fabricated by firstly depositing the buffer layer 302 on the surface of the base substrate 301 to avoid impurities in the base substrate 301 from being diffused into the active layer 303 in a heating process, which might otherwise increase leakage current in the transistor; and of course, if the respective transistors is in a top-gate structure, then the first electrode and/or the second electrode of the control capacitor may be a metal electrode at a film layer between the active layer 303 and the common electrode 309.

In one embodiment, as illustrated in FIG. 3A and FIG. 3B, if there is a metal electrode, i.e., a first metal electrode 312, arranged at a layer between the active layer 303, and the layer where the common electrode 309 is located, then the first metal electrode 312 may be arranged at the same layer as the data line 307, and insulated from the data line 307, and the first metal electrode 312 may be electrically connected with the common electrode 309 through a via-hole (as illustrated in FIG. 3A) or a wire (as illustrated in FIG. 3B), or a common electrode signal generated by a common electrode driver may be loaded on the first metal electrode 312 directly through the wire (as illustrated in FIG. 3B) so that the potential of the first metal electrode 312 is the potential of the common electrode. As a result, the first electrode of the control capacitor is the first metal electrode 312 arranged at the same layer as the data line 307, and insulated from the data line 307, and the second electrode of the control capacitor is the area of the active layer 303 facing the first metal electrode 312, i.e., the area defined inside the dotted box.

Alternatively as illustrated in FIG. 3C and FIG. 3D, if there is a metal electrode, i.e., the second metal electrode 313, arranged at a layer between the active layer 303, and the layer where the common electrode 309 is located, then the second metal electrode 313 may be arranged at the same layer as the gate line 305, and insulated from the gate line 305, and the second metal electrode 313 may be electrically connected with the common electrode 309 through a via-hole (as illustrated in FIG. 3C) or a wire (as illustrated in FIG. 3D), or a common electrode signal generated by a common electrode driver may be loaded on the second metal electrode 313 directly through the wire (as illustrated in FIG. 3D) so that the potential of the second metal electrode 313 is the potential of the common electrode; and moreover if the second metal electrode 313 is electrically connected with the common electrode 309 through a via-hole, then the via-hole needs to run through both the passivation layer 306 and the first insulation layer 308, thus making it difficult to fabricate the via-hole. In order to address this, typically a transitional metal electrode 313a is added to the first insulation layer as illustrated in FIG. 3E, where the transitional metal electrode 313a is pattern together with the source and the drain of the transistor so that the second metal electrode 313 is firstly electrically connected with the transitional metal electrode 313a through the via-hole, and thereafter when forming the common electrode 309, with the pattern process, the transitional metal electrode 313a is electrically connected with the common electrode 309 through the via-hole, and finally the second metal electrode 313 is electrically connected with the common electrode 309. As a result, the first electrode of the control capacitor is the second metal electrode 313 arranged at the same layer as the gate line 305, and insulated from the gate line 305, and the second electrode of the control capacitor is the area of the active layer 303 facing the second metal electrode 313, i.e., the area defined inside the dotted box.

Alternatively as illustrated in FIG. 3F, if there is a metal electrode, i.e., the third metal electrode 314, arranged at a layer between the active layer 303, and the layer where the common electrode 309 is located, then the third metal electrode 314 may be arranged at the same layer as the gate line 305, and insulated from the gate line 305, and the third metal electrode 314 may be electrically connected with the active layer 303 through a via-hole, so that the potential of the third metal electrode 314 is the potential of the active layer 303 facing the third metal electrode 314. As a result, the second electrode of the control capacitor is the third metal electrode 314 arranged at the same layer as the gate line 305, and insulated from the gate line 305, and the first electrode of the control capacitor is the area of the common electrode 309 facing the third metal electrode 314, i.e., the area defined inside the dotted box; and the third metal electrode 314 is electrically connected with the active layer 303.

Alternatively as illustrated in FIG. 3G and FIG. 3H, there may be two metal electrodes, i.e., the fourth metal electrode 315 and the fifth metal electrode 316, arranged between the active layer 303, and the layer where the common electrode 309 is located, then the fourth metal electrode 315 may be arranged at the same layer as the data line 307, and insulated from the data line 307, and the fourth metal electrode 315 may be electrically connected with the common electrode 309 through a via-hole (as illustrated in FIG. 3G) or a wire (as illustrated in FIG. 3H), or a common electrode signal generated by a common electrode driver may be loaded on the fourth metal electrode 315 directly through the wire (as illustrated in FIG. 3H) so that the potential of the fourth metal electrode 315 is the potential of the common electrode. The fifth metal electrode 316 may be arranged at the same layer as the gate line 305, and insulated from the gate line 305, and the fifth metal electrode 316 may be electrically connected with the active layer 303 through a via-hole, so that the potential of the fifth metal electrode 316 is the potential of the area of the active layer 303 facing the fifth metal electrode 316. As a result, the first electrode of the control capacitor is the fourth metal electrode 315 arranged at the same layer as, and insulated from the data line 307, and the second electrode of the control capacitor is the fifth metal electrode 316 arranged at the same layer as, and insulated from the gate line 305, i.e., the area defined inside the dotted box; and the fifth metal electrode 316 is electrically connected with the active layer 303.

Figure 5A:
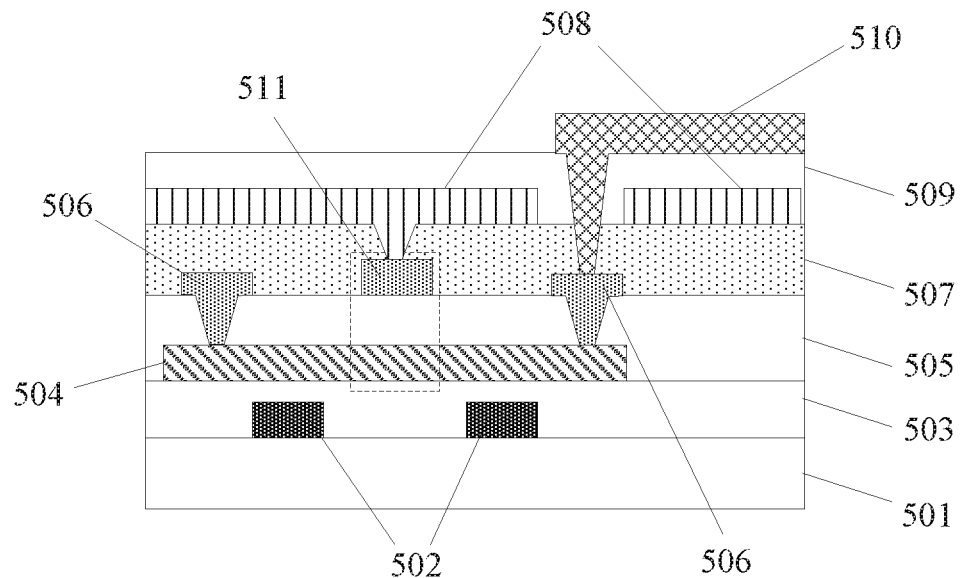
FIG. 5A to FIG. 5D are schematic structural diagrams of respective film layers in respective transistors in a bottom-gate structure in accordance with embodiments of the invention respectively.
Figure 5B:
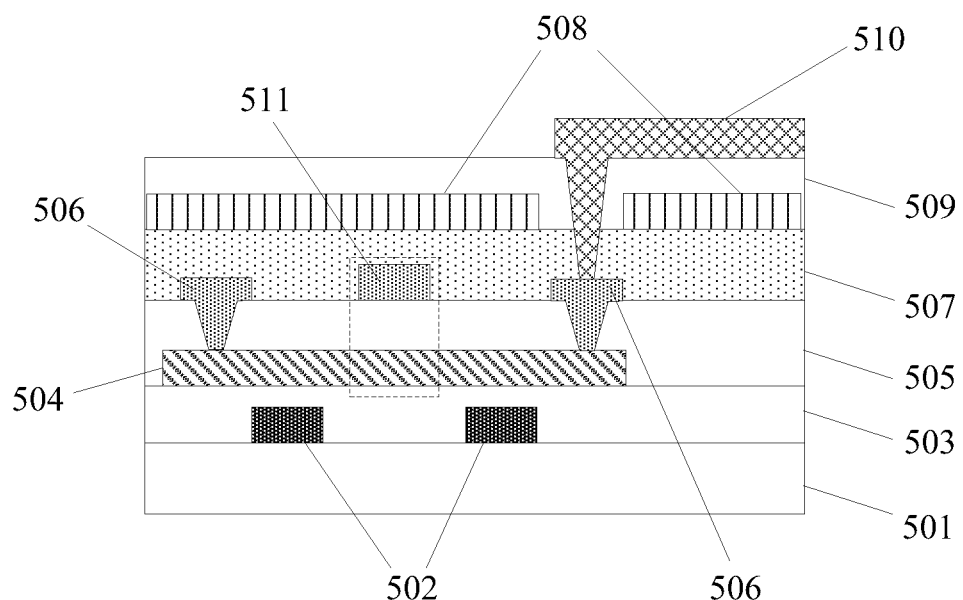
Figure 5C:
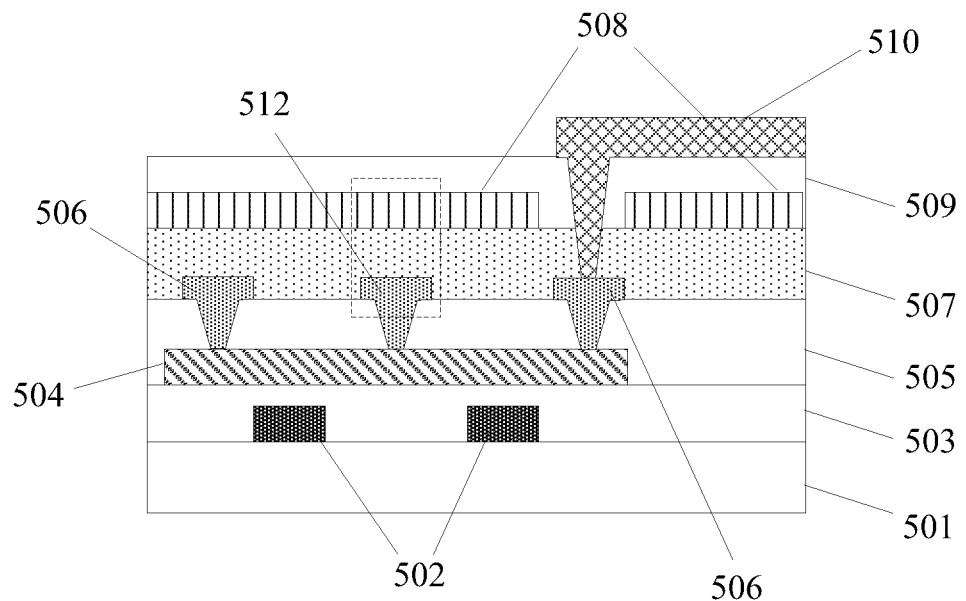
Figure 5D:
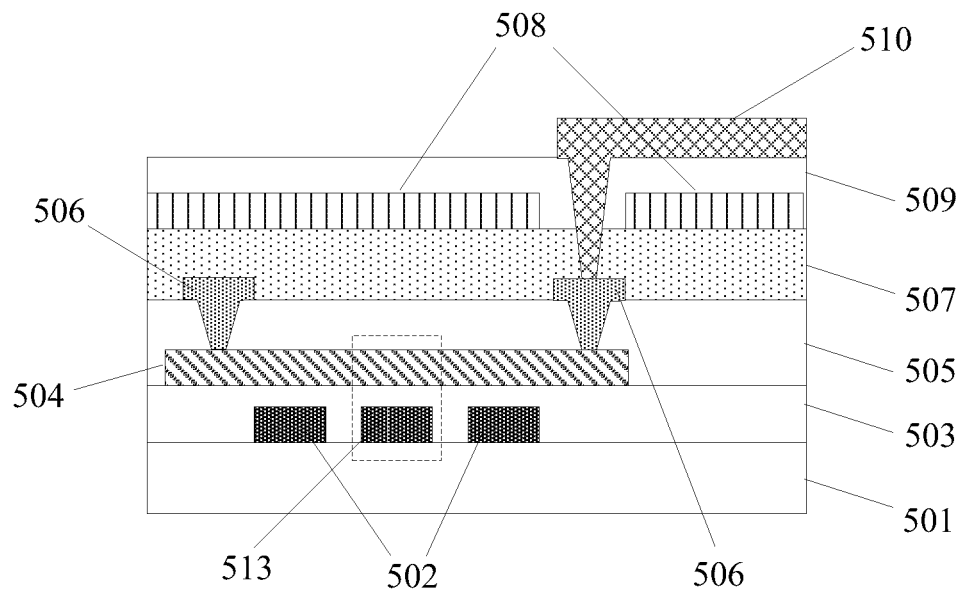
Figure 6A:
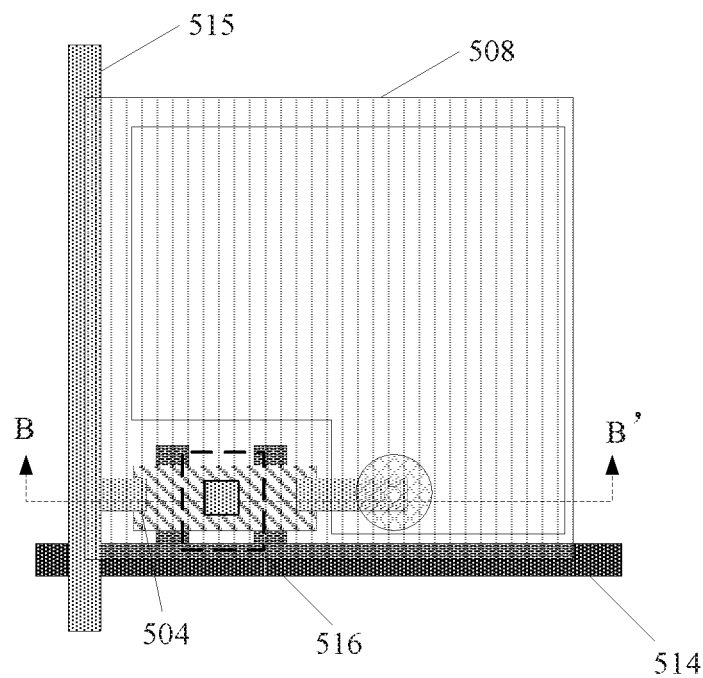
FIG. 6A and FIG. 6B are top views of an array substrate in respective transistors in a top-gate structure in accordance with embodiments of the invention.
Figure 6B:
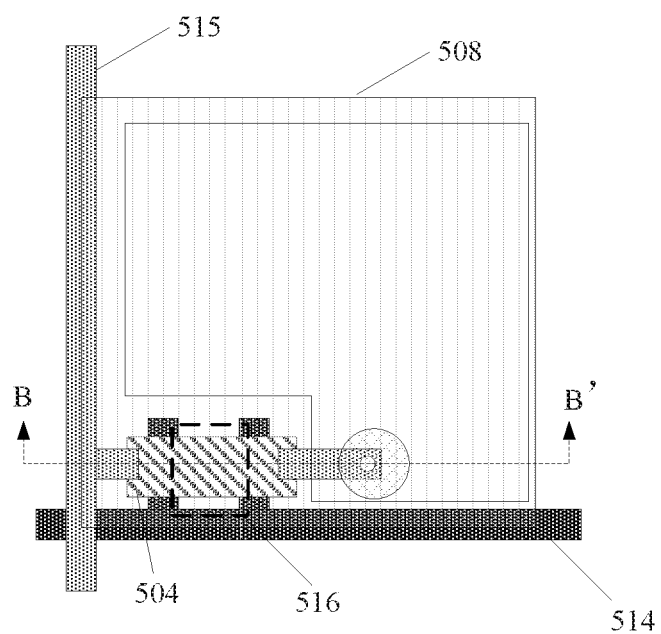

If both the first switch transistor and the second switch transistor are in a bottom-gate structure, then FIG. 5A to FIG. 5D may illustrate schematic structural diagrams of respective layers, where 501 represents a base substrate, 502 represents a buffer layer, 503 represents a gate insulation layer, 504 represents an active layer, 505 represents a passivation layer, 506 represents a source or a drain of a transistor, 507 represents a first insulation layer, 508 represents a common electrode. 509 represents a second insulation layer, and 510 represents a pixel electrode; and of course, if the respective transistors are in a bottom-gate structure, then the first electrode or the second electrode of the control capacitor may be a metal electrode arranged at the same layer as, and insulated from the data line 506 or the gate line 502. Therefore when the first electrode or the second electrode of the control capacitor is a metal electrode arranged at the same layer as, and insulated from the gate line 502, then FIG. 6B may illustrates a corresponding top view thereof, where 514 represents a gate line, 515 represents a data line, a dotted box 516 represents a control capacitor, 504 represents the active layer, and 508 represents the common electrode, and FIG. 5A to FIG. 5C are side views along BB' in FIG. 6A, and FIG. 5D is a side view along BB' in FIG. 6B.

In one embodiment, in FIG. 5A to FIG. 5D, since the respective transistors are in a bottom-gate structure, the array substrate is fabricated by fabricating the gate 502 and the gate insulation layer 503 on the surface of the underlying base substrate 501 before the active layer 504 is deposited, so that the gate insulation layer 503 can avoid in effect impurities in the underlying base substrate 501 from being diffused into the active layer 504 in a heating process, so no buffer layer may be further deposited above the underlying base substrate 501 to thereby dispensing with the buffer layer to be arranged, so as to facilitate a lower fabrication cost.

In one embodiment, as illustrated in FIG. 5A and FIG. 5B, if there is a metal electrode, i.e., a sixth metal electrode 511, arranged at a layer between the active layer 504, and the layer where the common electrode 508 is located, then the sixth metal electrode 511 may be arranged at the same layer as, and insulated from the data line 506, and the sixth metal electrode 511 may be electrically connected with the common electrode 508 through a via-hole (as illustrated in FIG. 5A) or a wire (as illustrated in FIG. 5B), or a common electrode signal generated by a common electrode driver may be loaded on the sixth metal electrode 511 directly through the wire (as illustrated in FIG. 5B) so that the potential of the sixth metal electrode 511 is the potential of the common electrode. As a result, the first electrode of the control capacitor is the sixth metal electrode 511 arranged at the same layer as the data line 506, and insulated from the data line 506, and the second electrode of the control capacitor is the area of the active layer 504 facing the sixth metal electrode 511, i.e., the area defined inside the dotted box.

Alternatively as illustrated in FIG. 5C, if there is a metal electrode, i.e., the seventh metal electrode 512, arranged at a layer between the active layer 504, and the layer where the common electrode 508 is located, then the seventh metal electrode 512 may be arranged at the same layer as the data line 506, and insulated from the data line 506, and electrically connected with the active layer 504 through a via-hole, so that the potential of the seventh metal electrode 512 is the potential of the area of the active layer 504 facing the seventh metal electrode 512. As a result, the second electrode of the control capacitor is the seventh metal electrode 512 arranged at the same layer as, and insulated from the data line 506, and the first electrode of the control capacitor is the area of the common electrode 508 facing the seventh metal electrode 512, i.e., the area defined inside the dotted box; and the seventh metal electrode 512 is electrically connected with the active layer 504.

Alternatively as illustrated in FIG. 5D, if there is a metal electrode, i.e., the eighth metal electrode 513, arranged at a layer between the base substrate 501 and the active layer 504, then the eighth metal electrode 513 may be arranged at the same layer as gate line 502, and insulated from the gate line 502, and the eighth metal electrode 513 may be electrically connected with a common electrode line through a wire, or a common electrode signal generated by a common electrode driver may be loaded to the eighth metal electrode 513 directly through the wire, so that the potential of the eighth metal electrode 513 is the potential of the common electrode. As a result, the first electrode of the control capacitor is eighth metal electrode 513 arranged at the same layer as the gate line 502, and insulated from the gate line 502, and the second electrode of the control capacitor is the area of the active layer 504 facing the eighth metal electrode 513, i.e., the area defined inside the dotted box.

Figure 7:
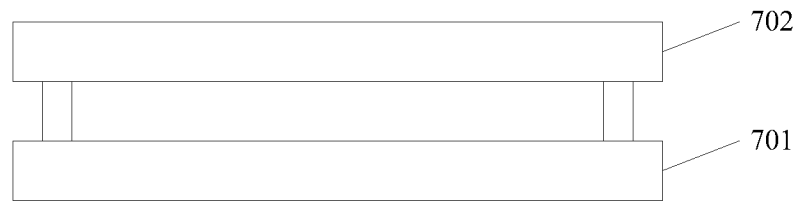
FIG. 7 is a schematic structural diagram of a display panel in accordance with an embodiment of the invention.

Based upon the same inventive idea, an embodiment of the invention further provides a display panel as illustrated in FIG. 7, which includes an array substrate 701 above according to the embodiments of the invention, and generally an opposite substrate 702 arranged opposite to the array substrate 703; and of course, the display panel may be a liquid crystal display panel, an electroluminescent display panel, or any other product or component capable of displaying using the pixel switches in the array substrate. For example, when the display panel is a liquid crystal display panel, then it may further include a liquid crystal layer encapsulated between the array substrate and the opposite substrate, an upper polarizing sheet arranged on the outer surface of the opposite substrate, a lower polarizing sheet arranged on the outer surface of the array substrate, and other components; and when the liquid crystal display is an electroluminescent display panel, then it may include an encapsulation component for encapsulating the array substrate, and other components in addition to the array substrate and the opposite substrate, although a repeated description thereof may be omitted here. Moreover reference can be made to the embodiments of the array substrate above for an implementation of the display panel, so a repeated description thereof may be omitted here.

Figure 8A:
FIG. 8A and FIG. 8B are schematic structural diagrams of a display device in accordance with embodiments of the invention respectively.
Figure 8B:
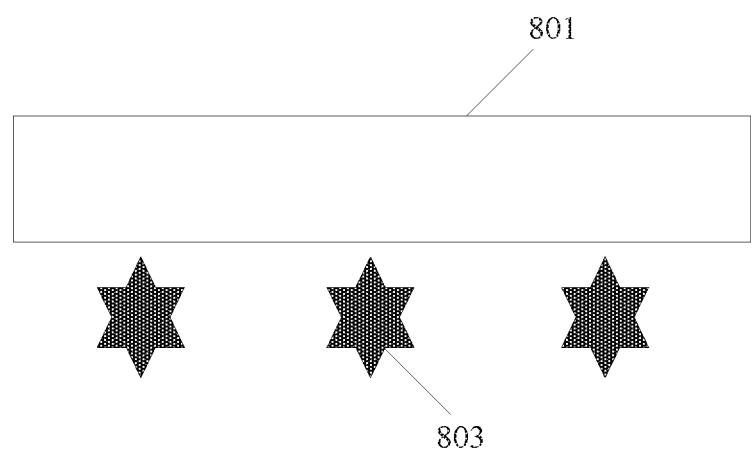
Figure 9:
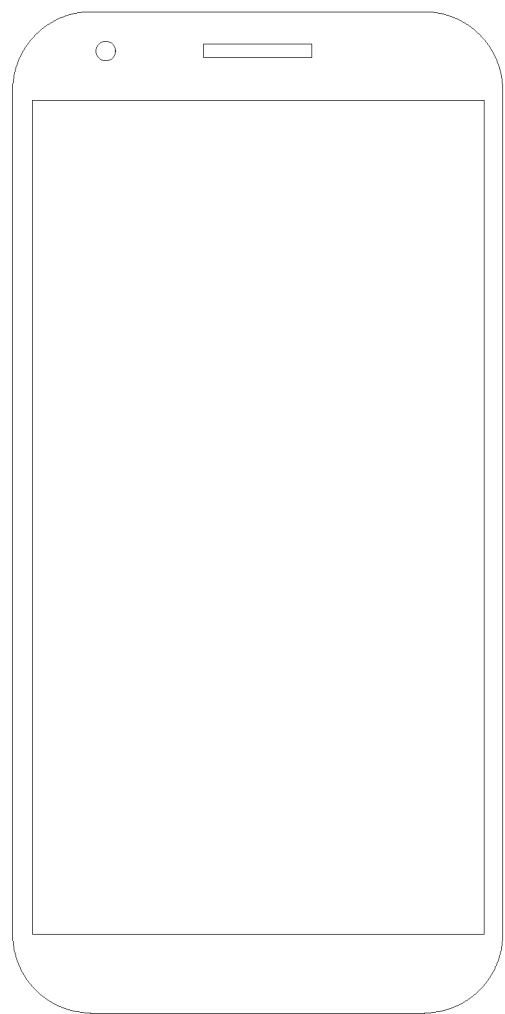
FIG. 9 is a schematic structural diagram of a display device in accordance with an embodiment of the invention.

Based upon the same inventive idea, an embodiment of the invention further provides a display device including the display panel above according to any one of the embodiments of the invention, where when the display panel is a liquid crystal display panel, then as illustrated in FIG. 8A and FIG. 8B, generally it further includes a side-arranged light source 802 located at a side of the display panel 801, or an immediately-below-arranged light source 803 located immediately below the display panel 801, where when the light source is the side-arranged light source, then the side-arranged light source 802 may be typically located on one side of the display panel 801 (as illustrated in FIG. 8A), or two opposite sides of the display panel, or four sides of the display plane; and when the light source is the immediately-below-arranged light source, then the immediately-below-arranged light source 803 may be located in the direction perpendicular to a surface of the display panel 801, and typically a plurality of immediately-below-arranged light sources may be arranged parallel to and spaced from each other as illustrated in FIG. 8B. On the other hand, when the display panel is an electroluminescent light-emitting display panel, then no additional light source may be needed. Of course, the display device can be a mobile phone (as illustrated in FIG. 9), a tablet computer, a TV set, a display, a notebook computer, a digital photo frame, a navigator, or any other product or component capable of displaying. Reference can be made to the embodiments of the display panel above for an implementation of the display device, so a repeated description thereof may be omitted here.

In the array substrate, the display panel, and the display device according to the embodiments of the invention, at least one control capacitor is added to a pixel zone, and the control capacitor has a first electrode at a fixed potential, and a second electrode at the same potential as a node between two adjacent transistors, so that when an active gate scan signal is stopped from being loaded on a gate line, the potential of the second electrode of the control capacitor is controlled to be kept at the potential of a data signal loaded on a data line, to thereby lower the difference in voltage between the source and the drain of a transistor associated with the second electrode of the control capacitor so as to keep the potential at a connection point of the transistor with a storage capacitor to be the potential of a data signal loaded on the data line, thus charging the pixel electrode sufficiently, and alleviating a picture from flickering due to insufficient charging thereof, etc.

Evidently those skilled in the art can make various modifications and variations to the invention without departing from the spirit and scope of the invention. Accordingly the invention is also intended to encompass these modifications and variations thereto so long as the modifications and variations come into the scope of the claims appended to the invention and their equivalents.

The invention claimed is:

1. An array substrate, comprising:
a substrate, gate lines and data lines arranged on the substrate crossing each other, a plurality of pixel zones arranged in an array and defined by the gate lines and the data lines, and a pixel switch, a storage capacitor, and at least one control capacitor in each of the plurality of pixel zones, wherein:
the pixel switch comprises at least two transistors connected in series, wherein gates of the at least two transistors are connected with one of the gate lines, a first transistor among the at least two transistors connected in series is connected with one terminal of the storage capacitor, and a last transistor among the at least two transistors connected in series is connected with one of the data lines; and
the number of the at least one control capacitor is less than the number of the at least two transistors; the control capacitor comprises a first electrode at a fixed potential, and a second electrode at the same potential as a node between two adjacent ones of the transistors; and the control capacitor is configured to control the potential of the second electrode of the control capacitor to be kept at the potential of a data signal loaded on the data line, when an active gate scan signal is stopped from being loaded on the gate line.

2. The array substrate according to claim 1, wherein there are no more than three transistors in the pixel switch.

3. The array substrate according to claim 1, wherein there is one control capacitor in each of the pixel zones, and the second electrode of the control capacitor at the potential of a node between the first transistor and its adjacent transistor.

4. The array substrate according to claim 3, wherein the pixel switch comprises a first transistor and a second transistor connected in series, both of which constitute a dual-gate structure.

5. The array substrate according to claim 4, wherein both the first transistor and the second transistor are N-type transistors or P-type transistors.

6. The array substrate according to claim 1, wherein the capacitance of each of the at least one control capacitor is less than the capacitance of the storage capacitor, and more than the capacitance of a parasitic capacitor between the gate line and the data line.

7. The array substrate according to claim 6, wherein there are a plurality of control capacitors in each of the pixel zones, and all the capacitances of the control capacitors in the pixel zone are equal to each other.

8. The array substrate according to claim 7, wherein the capacitances of the control capacitors in different pixel zones are equal to each other.

9. The array substrate according to claim 1, wherein the storage capacitor is consisted of a pixel electrode and a common electrode; and the first electrode of the control capacitor is at the potential of the common electrode, and the second electrode of the control capacitor is at the potential of an active layer connected between two adjacent ones of the transistors.

10. The array substrate according to claim 9, wherein the transistors are in a top-gate structure, and the first electrode and/or the second electrode of the control capacitor is a metal electrode at a layer arranged between the active layer and the common electrode.

11. The array substrate according to claim 10, wherein the first electrode of the control capacitor is a first metal electrode arranged at the same layer as the data line, and insulated from the data line, and the second electrode of the control capacitor is an area of the active layer facing the first metal electrode.

12. The array substrate according to claim 10, wherein the first electrode of the control capacitor is a second metal electrode arranged at the same layer as the gate line, and insulated from the gate line, and the second electrode of the control capacitor is an area of the active layer facing the second metal electrode.

13. The array substrate according to claim 10, wherein the second electrode of the control capacitor is a third metal electrode arranged at the same layer as the gate line, and insulated from the gate line, and the first electrode of the control capacitor is an area of the common electrode facing the third metal electrode; and
    the third metal electrode is electrically connected with the active layer.

14. The array substrate according to claim 10, wherein the first electrode of the control capacitor is a fourth metal electrode arranged at the same layer as the date line, and insulated from the date line, and the second electrode of the control capacitor is a fifth metal electrode arranged at the same layer as the gate line, and insulated from the gate line; and
    the fifth metal electrode is electrically connected with the active layer.

15. The array substrate according to claim 9, wherein the transistors are in a bottom-gate structure, and the first electrode and/or the second electrode of the control capacitor is a metal electrode arranged at the same layer as the data line or the gate line, and insulated from the data line or the gate line.

16. The array substrate according to claim 15, wherein the first electrode of the control capacitor is a sixth metal electrode arranged at the same layer as the data line, and insulated from the data line, and the second electrode of the control capacitor is an area of the active layer facing the sixth metal electrode.

17. The array substrate according to claim 15, wherein the second electrode of the control capacitor is a seventh metal electrode arranged at the same layer as the data line, and insulated from the data line, and the first electrode of the control capacitor is an area of the common electrode facing the seventh metal electrode; and
    the seventh metal electrode is electrically connected with the active layer.

18. The array substrate according to claim 15, wherein the first electrode of the control capacitor is an eighth metal electrode arranged at the same layer as the gate line, and insulated from the gate line, and the second electrode of the control capacitor is an area of the active layer facing the eighth metal electrode.

19. A display panel comprising:
an array substrate, the array substrate comprises:
    a substrate, gate lines and data lines arranged on the substrate crossing each other, a plurality of pixel zones arranged in an array and defined by the gate lines and the data lines, and a pixel switch, a storage capacitor, and at least one control capacitor in each of the plurality of pixel zones, wherein:
    the pixel switch comprises at least two transistors connected in series, wherein gates of the at least two transistors are connected with one of the gate lines, a first transistor among the at least two transistors connected in series is connected with one terminal of the storage capacitor, and a last transistor among the at least two transistors connected in series is connected with one of the data lines; and
    the number of the at least one control capacitor is less than the number of the at least two transistors; the control capacitor comprises a first electrode at a fixed potential, and a second electrode at the same potential as a node between two adjacent ones of the transistors; and the control capacitor is configured to control the potential of the second electrode of the control capacitor to be kept at the potential of a data signal loaded on the data line, when an active gate scan signal is stopped from being loaded on the gate line.

20. A display device, comprising:
a display panel including:
an array substrate, the array substrate having:
    a substrate, gate lines and data lines arranged on the substrate crossing each other, a plurality of pixel zones arranged in an array and defined by the gate lines and the data lines, and a pixel switch, a storage capacitor, and at least one control capacitor in each of the plurality of pixel zones, wherein:
    the pixel switch comprises at least two transistors connected in series, wherein gates of the at least two transistors are connected with one of the gate lines, a first transistor among the at least two transistors connected in series is connected with one terminal of the storage capacitor, and a last transistor among the at least two transistors connected in series is connected with one of the data lines; and
    the number of the at least one control capacitor is less than the number of the at least two transistors; the control capacitor comprises a first electrode at a fixed potential, and a second electrode at the same potential as a node between two adjacent ones of the transistors; and the control capacitor is configured to control the potential of the second electrode of the control capacitor to be kept at the potential of a data signal loaded on the data line, when an active gate scan signal is stopped from being loaded on the gate line.

* * * * *